United States Patent
Do et al.

(10) Patent No.: US 8,300,481 B2
(45) Date of Patent: *Oct. 30, 2012

(54) APPARATUS AND METHOD FOR TRANSMITTING/RECEIVING SIGNALS AT HIGH SPEED

(75) Inventors: Chang-Ho Do, Kyoungki-do (KR); Jae-Il Kim, Kyoungki-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/113,503

(22) Filed: May 23, 2011

(65) Prior Publication Data

US 2011/0222359 A1 Sep. 15, 2011

Related U.S. Application Data

(63) Continuation of application No. 12/068,583, filed on Feb. 8, 2008, now Pat. No. 7,974,142.

(30) Foreign Application Priority Data

Sep. 4, 2007 (KR) .............................. 2007-0089552
Jan. 24, 2008 (KR) .............................. 2008-0007632

(51) Int. Cl.
    *G11C 7/10* (2006.01)
(52) U.S. Cl. ....... 365/189.17; 365/189.05; 365/189.011; 365/194
(58) Field of Classification Search ............. 365/189.17, 365/189.05, 189.011, 194
    See application file for complete search history.

(56) References Cited

U.S. PATENT DOCUMENTS 7,423,920 B2 * 9/2008 Koo .............................. 365/194
7,974,142 B2 * 7/2011 Do et al. .................. 365/189.17

* cited by examiner

*Primary Examiner* — Toan Le
(74) *Attorney, Agent, or Firm* — IP & T Group LLP (57) ABSTRACT

A semiconductor memory device includes: a data transferrer configured to transfer data; a main driver configured to apply the data to the data transferrer in response to a control signal; and a pre-driver configured to decrease a voltage level of the data transferrer when the voltage level of the data transferrer is higher than a logic threshold voltage, and to increase the voltage level of the data transferrer when the voltage level of the data transferrer is lower than the logic threshold voltage prior to activation of the control signal.

14 Claims, 12 Drawing Sheets

APPARATUS AND METHOD FOR TRANSMITTING/RECEIVING SIGNALS AT HIGH SPEED

CROSS-REFERENCE TO RELATED APPLICATIONS

This application is a continuation of U.S. patent application Ser. No. 12/068,583 filed on Feb. 8, 2008 and issued on Jul. 5, 2011 as U.S. Pat. No. 7,974,142, which claims priority of Korean patent application numbers 10-2007-0089552 and 10-2008-0007632, filed on Sep. 4, 2007 and Jan. 24, 2008 respectively. The disclosure of each of the foregoing applications is incorporated herein by reference in its entirety.

BACKGROUND OF THE INVENTION

The present subject matter relates to an apparatus and a method for transmitting/receiving signals at high speed, and more particularly, to an apparatus and a method for transmitting/receiving signals and data within a semiconductor memory device and a system having the semiconductor memory device.

In a system implemented with a variety of semiconductor devices, a semiconductor memory device serves as a data storage. When a central processing unit (CPU) requests data, the semiconductor memory device outputs data corresponding to addresses received from the CPU. In addition, the semiconductor memory device stores data received from the CPU into corresponding unit cells.

As the operating speed of the system increases and semiconductor integrated circuit (IC) technologies are rapidly developed, the semiconductor memory devices are required to output or store data at higher speed. In order for the semiconductor memory device to stably operate at higher speed, internal circuits of the semiconductor memory device must be able to operate at a high speed and transmit signals and data therebetween at the high speed.

The semiconductor memory device includes control circuits, signal lines, and transfer circuits. The control circuits read data from unit cells or write data on unit cells through the signal lines. Since data transfer units are provided to transfer data to locations all around the semiconductor memory device having a plurality of banks, their signal lines are longer than any other data transfer unit or other control signal line. In addition, the semiconductor memory device may further include various data transfer units, signal lines, or various circuits so as to obtain its stable operation and prevent interference. However, there is a limitation in high-speed data transmission because such data transfer units have a large load.

As transfer speeds of data/signal buses and lines increase, operating speed of the semiconductor memory device is increasing. Especially, operation performance of the semiconductor memory device is improved when the semiconductor memory device outputs data stored in unit cells at a high speed after an external command is inputted. Regarding this, a column address strobe (CAS) latency is described in the specification of the semiconductor memory device. The CAS latency represents number of clocks from an input of an external read command to an output of data stored in a unit cell. As data is outputted at higher speed after the input of the external read command, the operating speed of the semiconductor memory device increases and its operation performance improves.

When the external read command is inputted, the semiconductor memory device recognizes a unit cell corresponding to an inputted address. At this point, a predetermined delay time occurs during the process of selecting the unit cell. Then, data stored in the selected unit cell is transferred through a data transfer unit to an output driver. Finally, the data is outputted through an output buffer to an external circuit. The process of transferring the data through the data transfer unit spends a significant portion of time necessary for outputting the data after the input of the read command. The reduction of this time can greatly contribute to increasing the operating speed of the semiconductor memory device.

Figure 1:
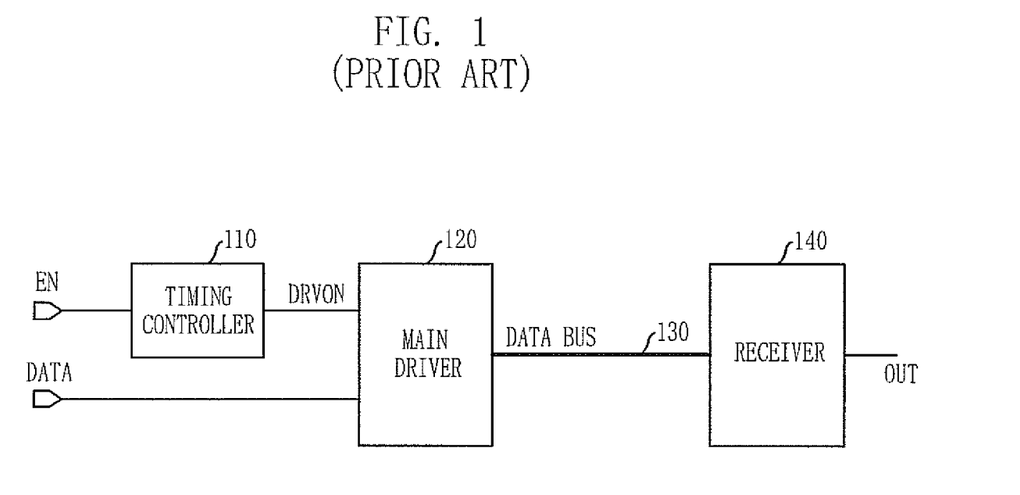
FIG. 1 is a block diagram of a conventional semiconductor memory device.

FIG. 1 is a block diagram of a conventional semiconductor memory device.

Referring to FIG. 1, the conventional semiconductor memory device includes a timing controller 110, a main driver 120, a data transferrer 130, and a receiver 140.

The timing controller 110 receives an enable signal EN to output a control signal DRVON for controlling the main driver 120. The enable signal EN enables circuits for transmitting/receiving data DATA according to an input of an external read command during a data output operation. The timing controller 110 enables the main driver 120 for a predetermined time necessary for transmitting the input data DATA by delaying the enable signal EN. The timing controller 110 can reduce unnecessary power consumption by enabling the main driver 120 only for a necessary time.

The main driver 120 transfers the input data DATA to the data transferrer 130 under the control of the timing controller 110. The data transferred through the data transferrer 130 is recognized by the receiver 140, and the recognized data is outputted through an output buffer (not shown) to an external circuit (not shown). In this way, the external circuit can acquire the output data OUT corresponding to the external command.

The data transferrer 130 is connected to a plurality of regions within the semiconductor memory devices, e.g., banks each having a plurality of unit cells. Accordingly, the main driver 120 transfers logic low data or logic high data, or interrupts the data transmission to the data transferrer 130 when no valid data exists.

Figure 2A:
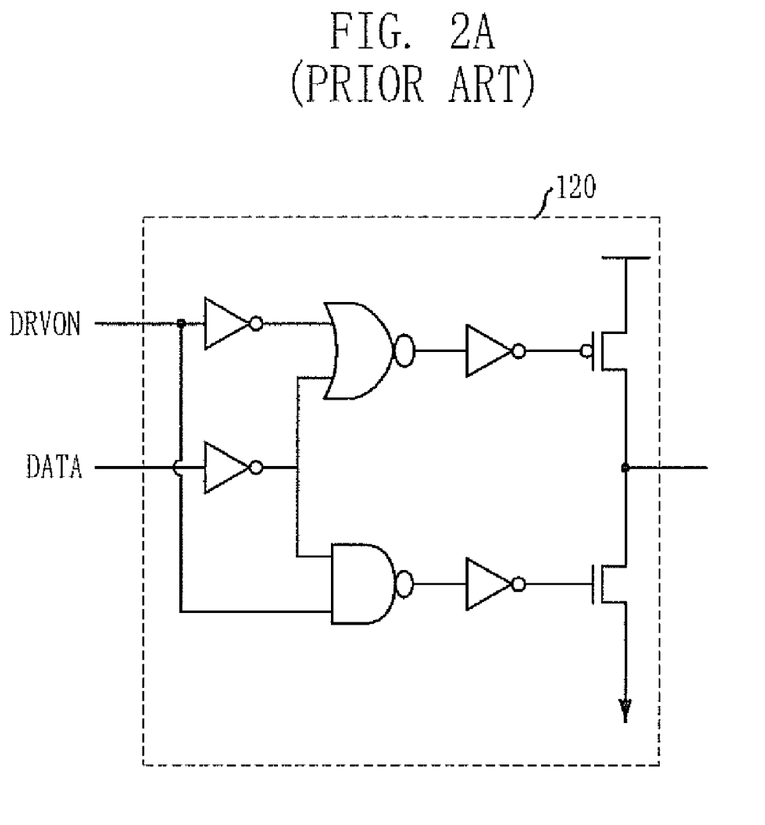
FIGS. 2A and 2B are circuit diagrams of a main driver and a receiver, respectively.
Figure 2B:
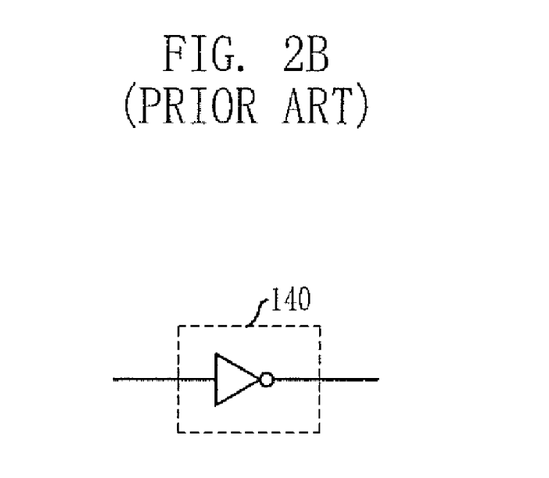

FIGS. 2A and 2B are circuit diagrams of the main driver 120 and the receiver 140, respectively.

Referring to FIG. 2A, the main driver 120 includes a tri-state driver configured to output the input data DATA in response to the control signal DRVON. The main driver 120 outputs a signal corresponding to an inverted level of the input data DATA to the data transferrer 130 during an activation of the control signal DRVON. The internal structure and operation of the main driver 120 implemented with a plurality of logic gates and transistors are well known to those skilled in the art and thus their detailed description will be omitted.

Because the main driver of FIG. 2A outputs the signal having the inverted level of the input data DATA, the receiver 140 of FIG. 1 is implemented with a single inverter, as illustrated in FIG. 2B.

The conventional semiconductor memory device transmits/receives data using the circuits of FIGS. 1, 2A and 2B. That is, the main driver 120 transmits the data under the control of the timing controller 110. However, when the data transferrer 130 has a large load, the data transfer speed in the data transferrer 130 reduces and the data transfer time increases.

In particular, when the data transferrer 130 is shared by a plurality of banks, unexpected delay may occur during the data transfer operation due to RC parameters, that is, resistance and parasitic capacitance of the data transferrer 130.

Therefore, the signal or data transfer speed needs to increase in the delay region such as the data transferrer with a large load.

SUMMARY OF THE INVENTION

Embodiments of the present invention are directed to providing an apparatus and a method that can rapidly change a voltage level of a data bus during a signal transfer operation by making the data bus have a predetermined voltage level prior to the signal transmission within a semiconductor device, an electronic device, and a system.

In accordance with an aspect of the present invention, there is provided a semiconductor memory device, including: a data transferrer configured to transfer data; a main driver configured to apply the data to the data transferrer in response to a control signal; and a pre-driver configured to decrease a voltage level of the data transferrer when the voltage level of the data transferrer is higher than a logic threshold voltage, and to increase the voltage level of the data transferrer when the voltage level of the data transferrer is lower than the logic threshold voltage prior to activation of the control signal.

In accordance with an aspect of the present invention, there is provided a semiconductor memory device, including: a data transferrer configured to transfer data; a main driver configured to apply the data to the data transferrer in response to a control signal; and a pre-driver configured to control a voltage level of the data transferrer in a predetermined range prior to activation of the control signal.

In accordance with an aspect of the present invention, there is provided a signal transmitting/receiving apparatus, including: a signal transferrer configured to transfer a signal in response to a control signal; and a pre-driver configured to decrease a voltage level of the signal transferrer when the voltage level of the signal transferrer is higher than a logic threshold voltage, and to increase the voltage level of the signal transferrer when the voltage level of the signal transferrer is lower than the logic threshold voltage prior to activation of the control signal.

In accordance with an aspect of the present invention, there is provided a signal transmitting/receiving apparatus, including: a signal transferrer configured to transfer a signal in response to a control signal; and a pre-driver configured to control a voltage level of the signal transferrer in a predetermined range which is ranged form a first voltage higher than a ground voltage by a threshold voltage to a second voltage lower than a power supply voltage by the threshold voltage prior to activation of the control signal.

In accordance with an aspect of the present invention, there is provided a signal transmitting/receiving method, including: decreasing a state of a signal transferrer when the state of the signal transferrer is higher than a logic threshold value prior to activation of a control signal; and increasing the state of the signal transferrer when the state of the signal transferrer is lower than the logic threshold value prior to activation of the control signal.

In accordance with an aspect of the present invention, there is provided a method for driving a semiconductor memory device, including: decreasing a voltage level of a data transferrer when the voltage level of the data transferrer is higher than a logic threshold value prior to activation of a control signal; and increasing the voltage level of the data transferrer when the voltage level of the data transferrer is lower than the logic threshold value prior to activation of the control signal.

In accordance with an aspect of the present invention, there is provided A signal transmitting/receiving a method, including: controlling a voltage level of a signal transferrer in a predetermined range which is ranged form a first voltage higher than a ground voltage by a threshold voltage to a second voltage lower than a power supply voltage by the threshold voltage prior to activation of a control signal, wherein the signal transferrer transfers a signal in response to the control signal.

DESCRIPTION OF SPECIFIC EMBODIMENTS

Hereinafter, an apparatus and a method for transmitting/receiving signals at high speed in accordance with the present invention will be described in detail with reference to the accompanying drawings.

In a high-speed system, an electronic device, or a semiconductor memory device, a signal transfer is delayed because a connection unit for connecting a transmitter and a receiver has a large load. To prevent this signal transfer delay, the system, the electronic device or the semiconductor memory device in accordance with the present invention includes an apparatus for driving the connection unit before valid signals are transferred. The apparatus in accordance with the present invention can increase the operation speed of the transmitter and the receiver.

In particular, the apparatus in accordance with the present invention can increase operation speeds of the transmitter, the connection unit, and the receiver in a case where a logic high level signal is first transferred, a case where a logic high level signal is transferred just after a logic low level is transferred, or a case where a logic low level signal is transferred just after a logic high level is transferred. The connection unit is a component for connecting the transmitter to the receiver.

Examples of the connection unit include internal components, such as a data transferrer, which can transfer data and signals.

Figure 3:
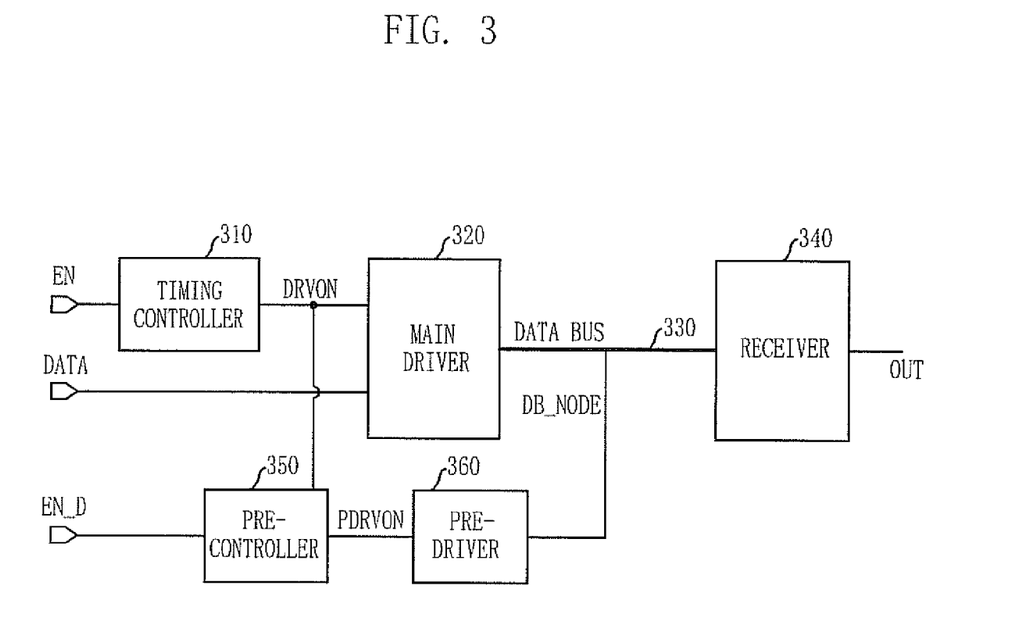
FIG. 3 is a block diagram of a semiconductor memory device in accordance with an embodiment of the present invention.

FIG. 3 is a block diagram of a semiconductor memory device in accordance with an embodiment of the present invention.

Referring to FIG. 3, the semiconductor memory device includes a timing controller 310, a main driver 320, a data transferrer 330, a receiver 340, a pre-controller 350, and a pre-driver 360.

The timing controller 310 receives an enable signal EN to output a control signal DRVON for controlling the main driver 320. The enable signal EN enables circuits for transmitting/receiving data DATA according to an input of an external read command during a data output operation. The timing controller 310 enables the main driver 320 for a predetermined time necessary for transmitting the input data DATA by delaying the enable signal EN. The timing controller 310 can reduce unnecessary power consumption by enabling the main driver 320 only for a necessary time.

The main driver 320 transfers the input data DATA to the data transferrer 330 under the control of the timing controller 310. The data transferred through the data transferrer 330 is recognized by the receiver 340, and the recognized data is outputted through an output buffer (not shown) to an external circuit (not shown). In this way, the external circuit can acquire the output data OUT corresponding to the external command.

The data transferrer 330 is connected to a plurality of regions within the semiconductor memory devices, e.g., banks, each of which has a plurality of unit cells. The data transferrer 330 may be a global data line. Accordingly, the main driver 320 transfers logic low data or logic high data, or interrupts the data transmission when no valid data exists.

In addition, the semiconductor memory device further includes the pre-controller 350 and the pre-driver 360 for reducing a delay time (tD) taken to transfer data through the data transferrer 330. As illustrated in FIG. 3, the control signal DRVON from the timing controller 310 is inputted to the pre-controller 350, and the pre-controller 350 generates a pre-control signal PDRVON using a delayed enable signal EN_D and the control signal DRVON. The delayed enable signal EN_D is generated by delaying the enable signal EN by a predetermined time. The delayed enable signal EN_D may be generated using a separate delayer or delay elements included in the timing controller 310. Before the main driver 320 transfers the input data DATA in response to the activated control signal DRVON, the pre-driver 360 applies a predetermined voltage to the data transferrer 330 in response to the pre-control signal PDRVON outputted from the pre-controller 350.

Before the valid input data DATA is transferred by the main driver 320, the data transferrer 330 may maintain a power supply voltage (VDD) level or a ground voltage (VSS) level. In case where the data transferrer 330 maintains the power supply voltage (VDD) level, the voltage level of the data transferrer 330 is maintained if the input data DATA of a logic high level is transferred. On the other hand, the voltage level of the data transferrer 330 decreases to the ground voltage (VSS) level if the input data DATA of a logic low level is transferred. In case where the data transferrer 330 maintains the ground voltage (VSS) level, the voltage level of the data transferrer 330 is maintained if the input data DATA of a logic low level is transferred. Otherwise, the voltage level of the data transferrer 330 increases to the power supply voltage (VDD) level. When no data is transferred, the data transferrer 330 maintains the ground voltage (VSS) level. This is because the semiconductor memory device dissipates much power if the data transferrer 330 maintains the power supply voltage (VDD) level even when no data is transferred.

While the data transferrer 330 maintains the ground voltage (VSS) level when no data is transferred, the voltage level of the data transferrer 330 increases if the logic high level is inputted. When the high voltage level increases until the receiver 340 recognizes the change of the logic level, the receiver 340 can output the data to an external circuit. The level at which the change of the logic level can be recognized is referred to as a logic threshold voltage. More specifically, the semiconductor memory device of FIG. 3 can determine the logic threshold voltage according to the main driver 320 and the receiver 340. That is, if the receiver 340 is implemented with MOS transistors turned on according to the voltage level of the data transferrer 330, the logic threshold voltage is equal to a threshold voltage of the MOS transistors.

If the data transferrer 330 maintains a voltage level lower than the logic threshold voltage of the receiver 340 before the data is transferred, the main driver 320 can transfer the data to the receiver 340 at higher speed. Even when the data of a logic high level is transferred, a time taken to increase the data transferrer 330 to a voltage level higher than the logic threshold voltage is shortened. When the data of a logic low level is transferred, a separate time for data transmission is unnecessary because the data transferrer 330 has already maintained the voltage level lower than the logic threshold voltage. In addition, when the data of a logic low level immediately after the data of the logic high level is transferred, the voltage remaining in the data transferrer 330 immediately before the transfer of the valid data decreases close to the logic threshold voltage. Therefore, a time necessary for transmitting a next valid data of a logic low level can be reduced.

To always maintain the data transferrer 330 at the voltage lower than the logic threshold voltage of the receiver 340, not a ground voltage VSS, so as to increase the data transfer speed is undesirable because the semiconductor memory device dissipates much power. Therefore, a predetermined voltage is applied to the data transferrer 330 immediately before the valid data is transferred to the data transferrer 330. This operation is performed by the pre-controller 350 and the pre-driver 360. Applying the predetermined voltage is controlled by the pre-control signal PDRVON that controls the pre-driver 360, and the applied voltage level is also determined by the pulse width of the pre-control signal PDRVON. Decreasing the data transferrer 330 having a logic high level immediately before the transfer of the next valid data is also controlled by the pre-control signal PDRVON, and the voltage level is determined by the pulse width of the pre-control signal PDRVON.

Figure 4A:
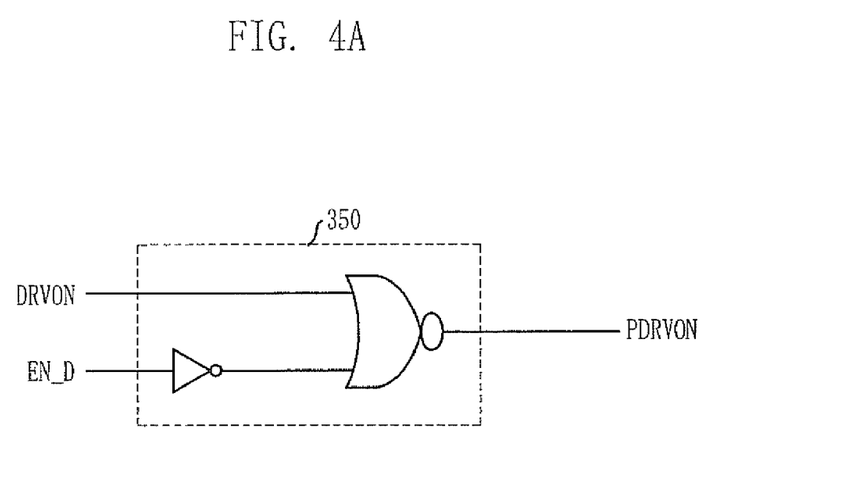
FIG. 4A is a circuit diagram of a controller illustrated in FIG. 3.

FIG. 4A is a circuit diagram of the pre-controller 350 illustrated in FIG. 3.

Referring to FIG. 4A, the pre-controller 350 includes an inverter and a NOR gate. The inverter is configured to invert the delayed enable signal EN_D, and the NOR gate is configured to perform a NOR operation on the control signal DRVON from the timing controller 310 and an output signal of the inverter to output the pre-control signal PDRVON.

Figure 4B:
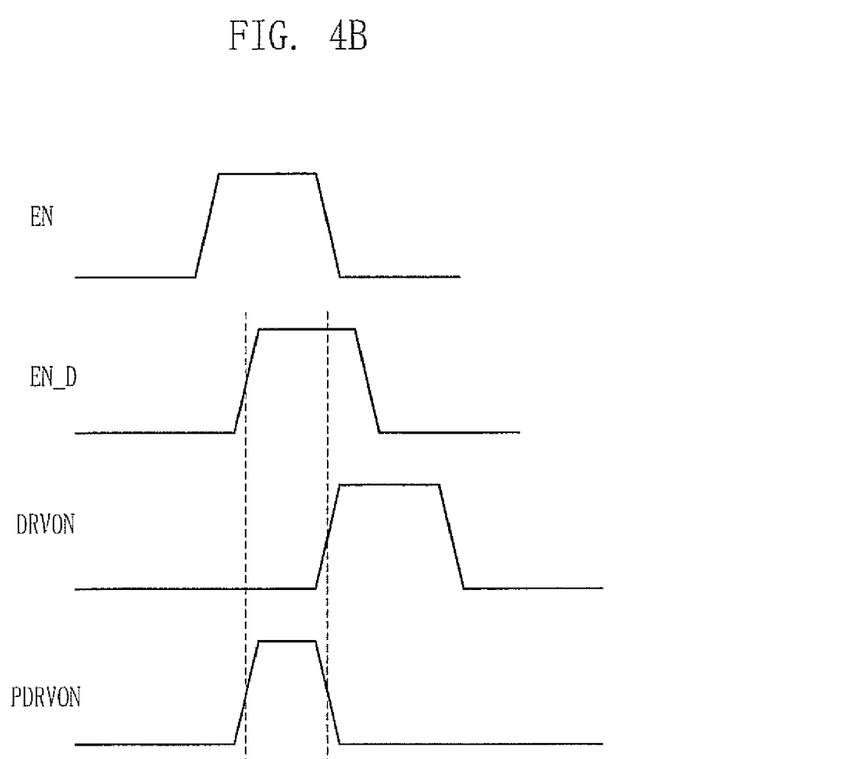
FIG. 4B is a waveform diagram illustrating an operation of the controller of FIG. 3.

FIG. 4B is a waveform diagram illustrating an operation of the pre-controller 350 of FIG. 3.

When an external read command is inputted, a predetermined time is taken to output data corresponding to the read command. To transfer the data, the semiconductor memory device activates the enable signal EN and inputs the enable signal EN to the timing controller 310. The timing controller 310 delays the enable signal EN by a first delay time such that the data corresponding to the read command can be normally outputted after a predetermined time, and generates the control signal DRVON for controlling the main driver 320. In addition, the delayed enable signal EN_D is generated by delaying the enable signal EN by a second delay time shorter than the first delay time by using the separate delayer or internal delay element provided in the timing controller 310. The pre-control signal PDRVON is generated according to the control signal DRVON and the delayed enable signal EN_D through the logic combination in the configuration of the pre-controller 350. Comparing the control signal DRVON with the pre-control signal PDRVON, the pre-control signal PDRVON is activated earlier than the control signal DRVON and then the control signal DRVON is activated immediately after the pre-control signal PDRVON is deactivated. Due to the pre-control signal PDRVON, the pre-driver 360 can apply a constant voltage to the data transferrer 330 immediately before the main driver 320 transfers the valid data DATA to the data transferrer 330.

As illustrated in FIG. 4B, the activation period and the activation start point of the pre-control signal PDRVON may not coincide with each other. In another embodiment of the present invention, the pre-driver 360 has only to apply or discharge a constant voltage before the main driver 320 transfers the valid data.

Figure 5A:
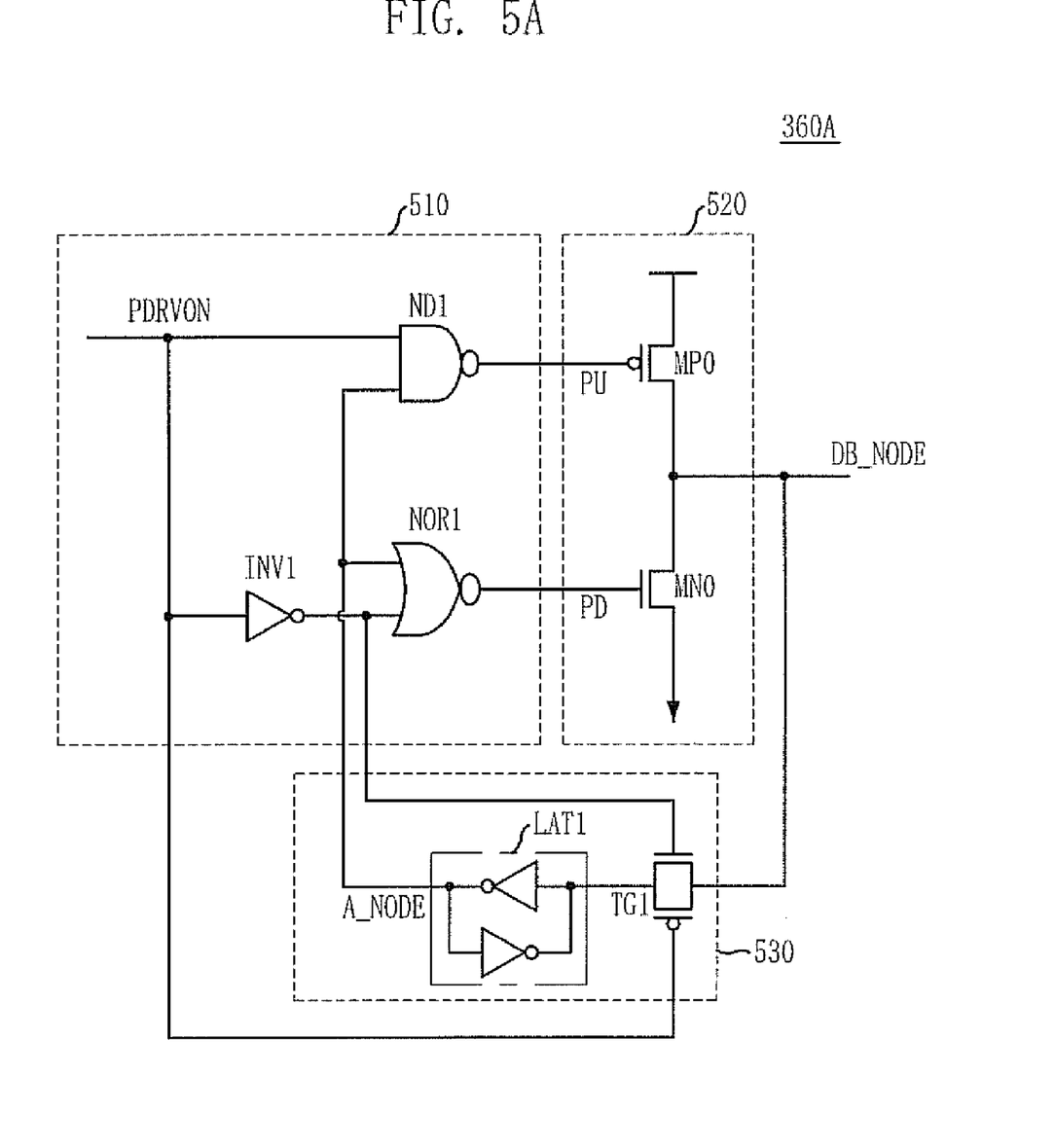
FIG. 5A is a circuit diagram of a pre-driver illustrated in FIG. 3 in accordance with a first embodiment of the present invention.

FIG. 5A is a circuit diagram of the pre-driver 360A illustrated in FIG. 3 in accordance with a first embodiment of the present invention.

Referring to FIG. 5A, the pre-driver 360A includes a driving control unit 510, a driving unit 520, and a state storage unit 530. The driving unit 520 and the state storage unit 530 are connected to a single node DB_NODE within the data transferrer 330.

The state storage unit 530 stores a current logic state of the data transferrer 330. The driving control unit 510 outputs first and second driving signals PU and PD in response to a logic value of the state storage unit 530 and the pre-control signal PDRVON. The driving unit 520 increases or decreases a voltage level of the single node DB_NODE within the data transferrer 330 to make the data transferrer 330 maintain a constant voltage.

More specifically, the state storage unit 530 includes a transfer gate TG1 configured to transfer the logic value of the data transferrer 330 in response to the pre-control signal PDRVON, and a latch LAT1 configured to store the logic value of the data transferrer 330. The state storage unit 530 outputs the inverted logic value of the data transferrer 330 to the driving control unit 510. The inverted current logic value of the data transferrer 330 is stored in an output terminal of the latch, i.e., a node A_NODE.

The driving control unit 510 includes a NAND gate ND1, an inverter INV1, and a NOR gate NOR1. The NAND gate ND1 is configured to generate the first driving signal PU according to the pre-control signal PDRVON and the inverted logic value of the data transferrer 330. The inverter INV1 is configured to invert the pre-control signal PDRVON. The NOR gate NOR1 is configured to generate the second driving signal PD according to an output signal of the inverter INV1 and the inverted logic value of the data transferrer 330.

The driving unit 520 for supplying the constant voltage to the data transferrer 330 includes a first MOS transistor MP0 configured to operate in response to the first driving signal PU, and a second MOS transistor MN0 configured to operate in response to the second driving signal PD.

Figure 5B:
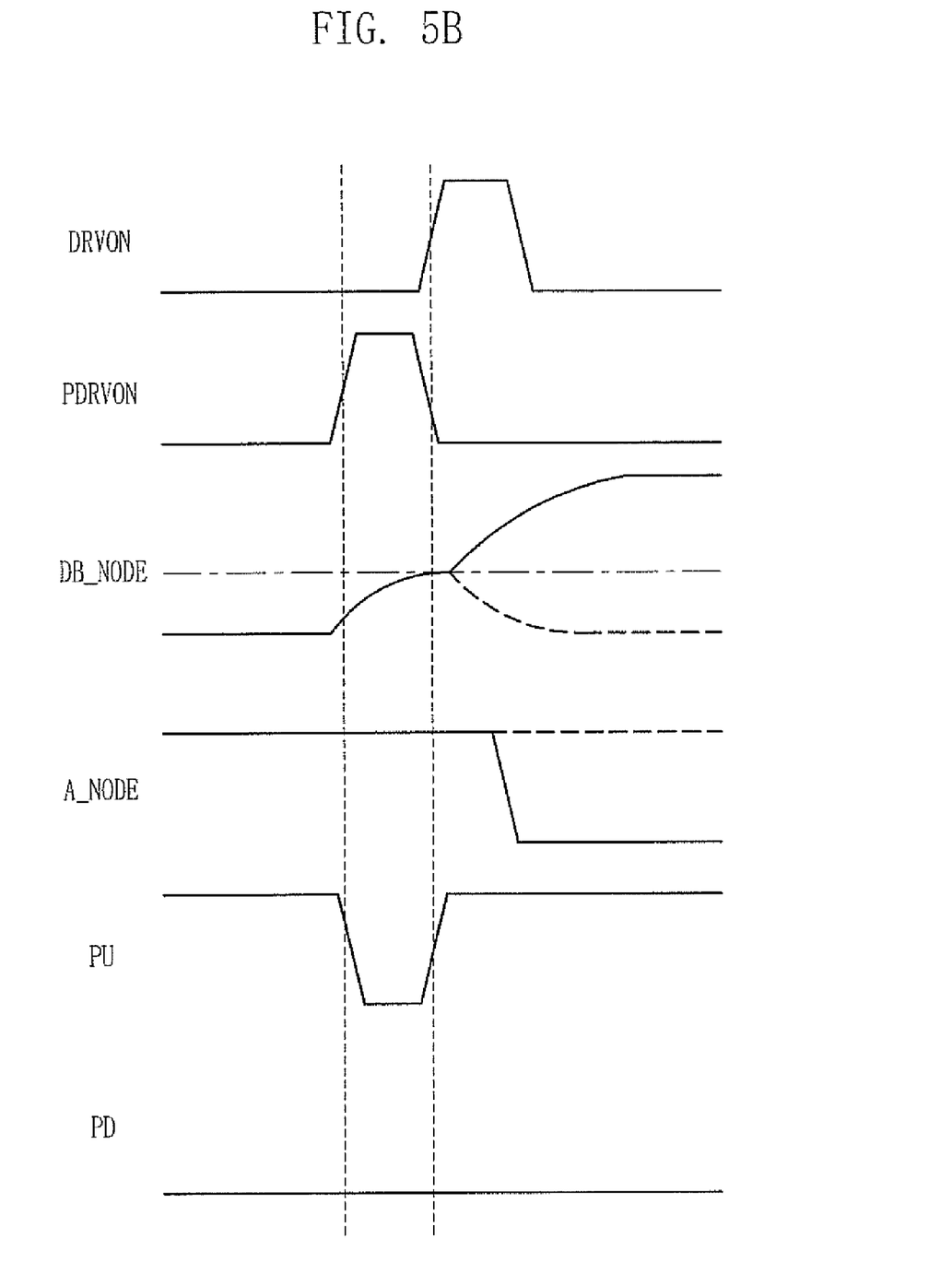
FIG. 5B is a timing diagram illustrating an operation of the pre-driver of FIG. 5A.

FIG. 5B is a timing diagram illustrating an operation of the pre-driver 360A of FIG. 5A.

The data transferrer 330 maintains the ground voltage (VSS) level when the data are not transferred. When the pre-control signal PDRVON is in a deactivated state, the node A_NODE of the state storage unit 530 in the pre-driver 360 becomes the power supply voltage (VDD) level. Before the pre-control signal PDRVON is activated, the first MOS transistor MP0 and the second MOS transistor MN0 of the driving unit 520 are turned off.

When the external read command is inputted and the pre-control signal PDRVON is activated to a logic high level, the transfer gate TG1 of the state storage unit 530 is disabled and the node A_NODE maintains the power supply voltage (VDD) level. At this point, the first driving signal PU becomes a logic low level by the NAND gate ND1 of the driving control unit 510. Consequently, the first MOS transistor MP0 of the driving unit 520 is turned on to apply a constant voltage to the data transferrer 330. The second MOS transistor MN0 of the driving unit 520 keeps maintaining the turned-off state.

When the pre-control signal PDRVON is deactivated, the pre-driver 360 stops supplying the constant voltage to the data transferrer 330, and the main driver 320 transfers the valid data DATA to the data transferrer 330 in response to the control signal DRVON.

When the valid data DATA is in a logic high level, the data transferrer 330 becomes a logic high level. Then, when the transfer gate TG1 of the state storage unit 530 is turned on in response to the pre-control signal PDRVON immediately before the next valid data is transferred, the node A_NODE of the state storage unit 530 in the pre-driver 360 changes to a logic low level. Because the data transferrer 330 decreases by the constant voltage level immediately before the next valid data is transferred, the next valid data can be rapidly transferred.

Accordingly, the maximum swing width of the data being transferred is reduced and thus the valid data DATA can be more rapidly transferred through the data transferrer 330. In addition, the receiver 340 can rapidly recognize the data DATA applied to the data transferrer 330. Consequently, the data can be transmitted/received through the data transferrer 330 at higher speed.

Due to the variations of process and supply voltage, error occurs at a time point when the driving unit 520 of the pre-driver 360 operates in response to the pre-control signal PDRVON and a time point in which the transfer gate of the state storage unit 530 is turned off in response to the pre-control signal PDRVON. Therefore, the pre-driver 360 may instantly abnormally operate when the constant voltage supplied from the pre-driver 360 to the data transferrer 330 is stored in the state storage unit 530. To solve this problem, another embodiment of the present invention is provided.

Figure 6A:
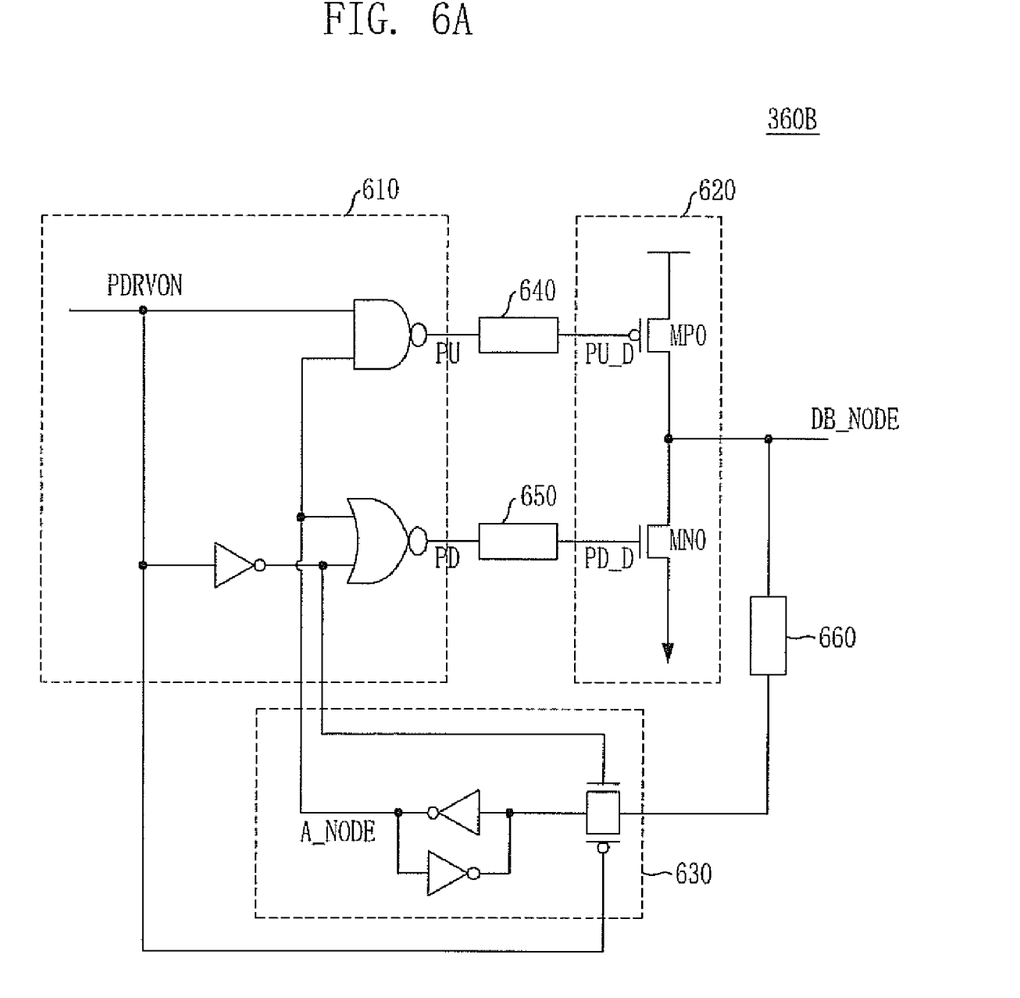
FIG. 6A is a circuit diagram of a pre-driver illustrated in FIG. 3 in accordance with a second embodiment of the present invention.

FIG. 6A is a circuit diagram of the pre-driver 360B illustrated in FIG. 3 in accordance with a second embodiment of the present invention.

Referring to FIG. 6A, the pre-driver 360B includes a driving control unit 610, a driving unit 620, a state storage unit 630, a first delay unit 640, a second delay unit 650, and a third delay unit 660. The driving unit 620 and the third delay unit 660 are connected to a node DB_NODE of the data transferrer 330.

The pre-driver 360B of FIG. 6A has the structure similar to the pre-driver 360A of FIG. 5A. In particular, since the driving control unit 610, the driving unit 620, and the state storage unit 630 have the same structures as those of FIG. 5A, their detailed description will be omitted.

The feature of the pre-driver 360B of FIG. 6A is that it further includes the first to third delay units 640, 650 and 660 between the driving control unit 610 and the driving unit 620 and between the state storage unit 630 and the data transferrer 330. The operation time points of the driving control unit 610, the driving unit 620, and the state storage unit 630 can be more definitely separated through the first to third delay units 640, 650 and 660.

To this end, the pre-driver 360B includes the first delay unit 640 configured to output the first delayed driving signal PU_D by delaying the first driving signal PU outputted from the driving control unit 610, the second delay unit 650 configured to output the second delayed driving signal PD_D by delaying the second driving signal PD, and the third delay unit 660 configured to delay the state of the node DB_NODE of the data transferrer 330 and supply the delayed state to the state storage unit 630.

The pre-driver 360B may not include all the first to third delay units 640, 650 and 660. Only the third delay unit 660 or only the first and second delay units 640 and 650 may be included so as to correctly control the operation time points of the driving control unit 610, the driving unit 620, and the state storage unit 630.

Figure 6B:
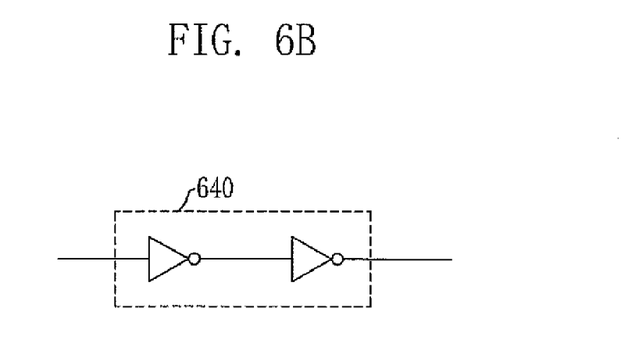
FIG. 6B is a circuit diagram of the delay unit of FIG. 6A.

FIG. 6B is a circuit diagram of the first delay unit 640 of FIG. 6A.

Referring to FIG. 6B, the first delay unit 640 may be implemented with two serially connected inverters. The first to third delay units 640, 650 and 660 may be modified in various ways only if they can correctly control the operation time points of the driving control unit 610, the driving unit 620, and the state storage unit 630.

Figure 7:
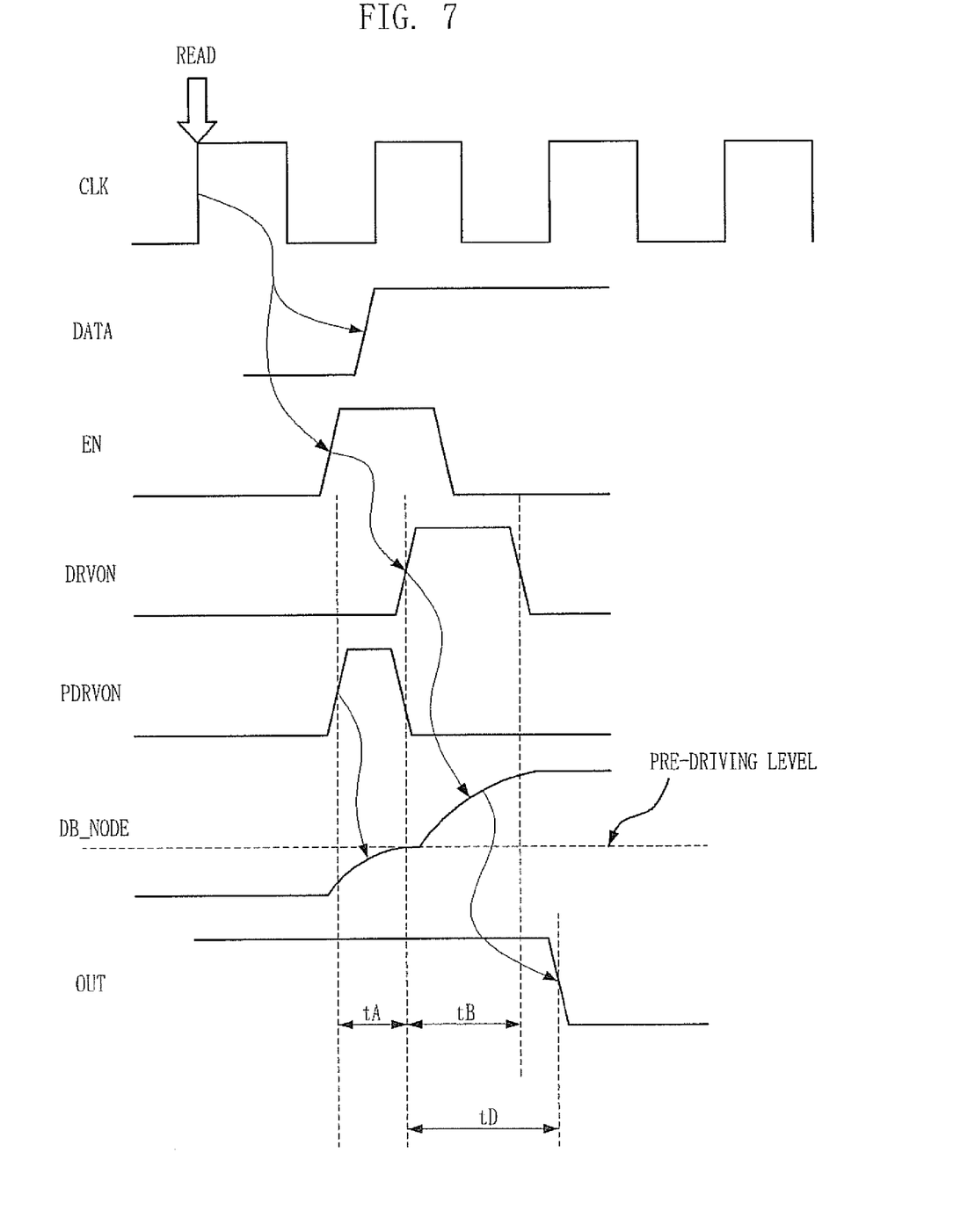
FIG. 7 is a timing diagram illustrating an operation of the semiconductor memory device of FIG. 3.

FIG. 7 is a timing diagram illustrating an operation of the semiconductor memory device of FIG. 3.

Referring to FIG. 7, the data DATA corresponding to the read command READ and the address is transferred after a predetermined time elapses from recognition of the read command READ. To effectively transfer the data DATA, the enable signal EN is activated prior to the transfer time point of the data DATA. Then, the control signal DRVON and the pre-control signal PDRVON are generated and the data is transferred to the node DB_NODE of the data transferrer 330. Since this process has been already described with reference to FIGS. 4B and 5B, its detailed description will be omitted.

An operation period "tA" of the pre-driver 360 and an operation period "tB" of the main driver 320 are illustrated in FIG. 7. Upon the operation of the pre-driver 360, the pre-driving level is applied to the data transferrer 330. Considering a time "tD" necessary to output the data DATA through the main driver 320, the data transferrer 330 and the receiver 340, the semiconductor memory device can transfer data without much delay time.

Figure 8:
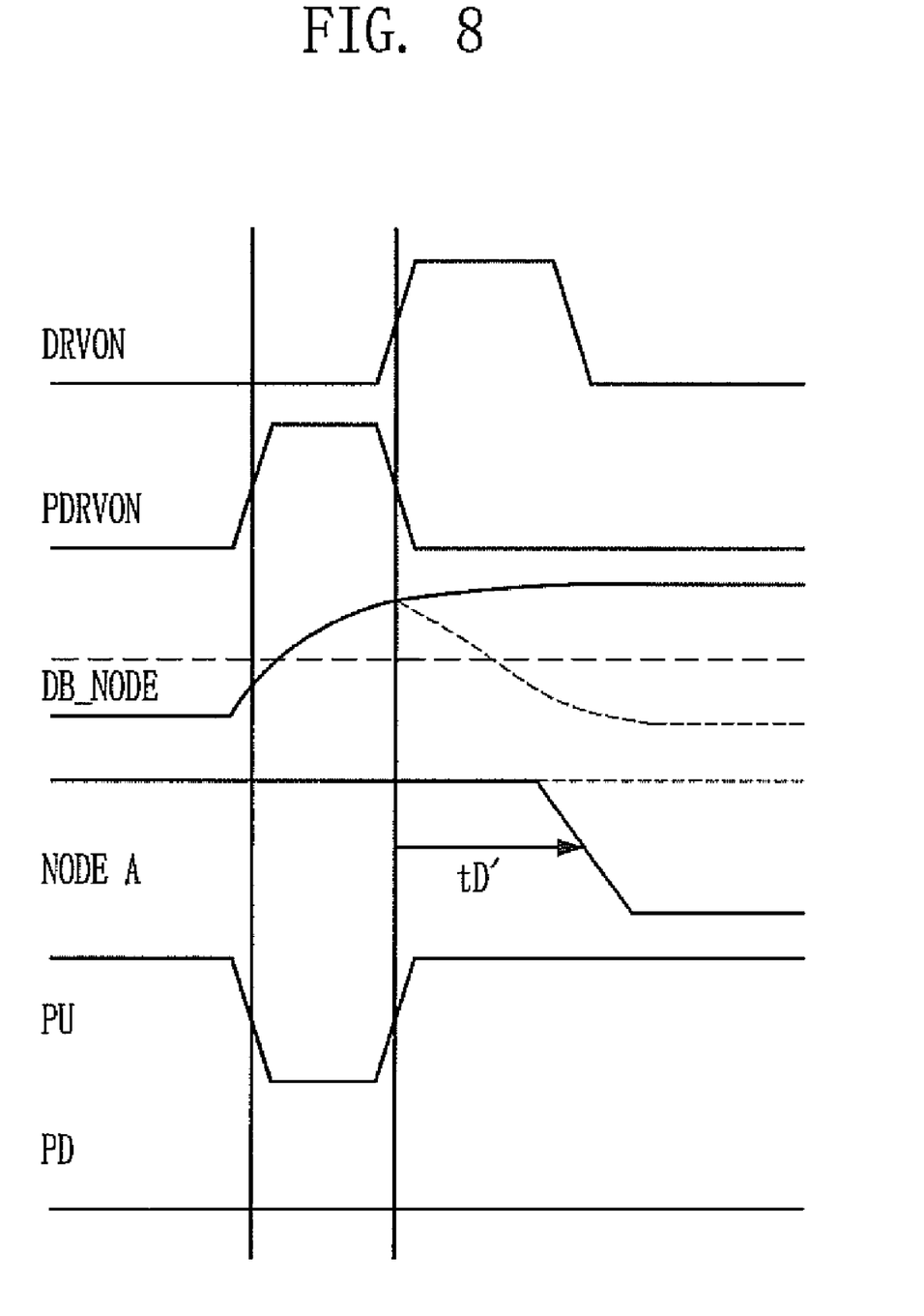
FIG. 8 is another timing diagram illustrating an operation of the pre-driver of FIG. 5A.

FIG. 8 is another timing diagram illustrating an operation of the pre-driver 360A of FIG. 5A.

Referring to FIG. 8, due to variations of process, voltage and temperature (PVT) a driving operation time of the pre-driver 360A may increase to excess, thereby driving the data transferrer 330 to excess. The voltage level applied on the data transferrer 330 can increase over a predetermined voltage level. Meanwhile, not in shown, in case that the driving operation time of the pre-driver 360A is relatively shorten the data transferrer 330 can not maintain the predetermined voltage level, thereby slowing down the operation speed for transmitting and receiving data.

Concretely, in case that a voltage level of a node DB_NODE which is connected to the data transferrer 330 become to increase over the predetermined voltage level, it takes more time for the main driver 320 to pull down the voltage level to a level for transmitting a logic low of data. At this time, a voltage level on a node A of the state storage unit 530 may fluctuate. By increasing a driving operation time of the main driver 320, malfunctions caused by the fluctuation can be prevented. Accordingly, against the purpose, i.e., a high speed of data transmission by reducing the driving operation time of the main driver 320 and a delay time tD for the data transmission, the driving operation time of the main driver 320 may increase for operation stability. To solve this problem, another embodiment of the present invention is provided.

Figure 9:
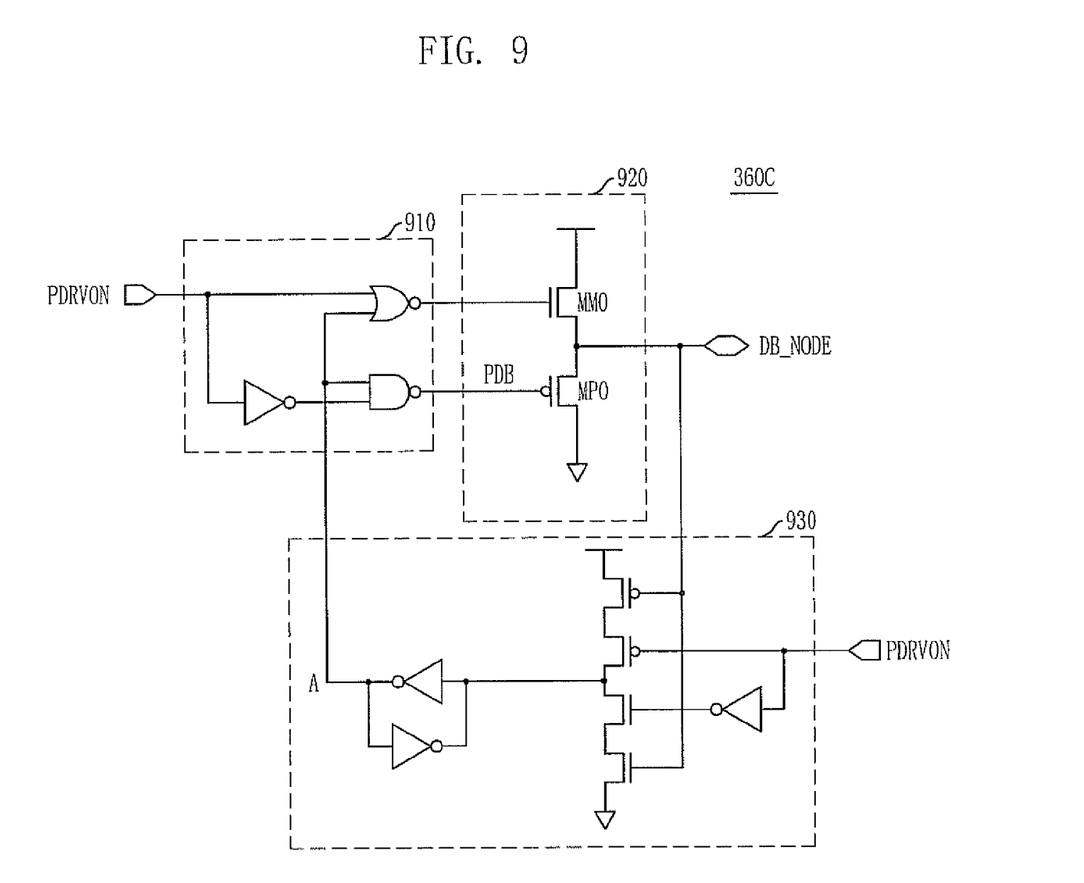
FIG. 9 is a circuit diagram of the pre-driver of the semiconductor memory driver in accordance with a third embodiment of the present invention.

FIG. 9 is a circuit diagram of the pre-driver of the semiconductor memory driver in accordance with a third embodiment of the present invention.

Referring to FIG. 9, the pre-driver 360C includes a driving control unit 910, a driving unit 920 and a state storage unit 930. The driving unit 920 and the state storage unit 930 are connected to a node DB_NODE of the data transferrer 330. The semiconductor memory device in accordance with an embodiment of the present invention includes a data transferrer, a main driver, a receiver and a timing controller the same as a conventional device. The descriptions in regard to the data transferrer, the main driver, the receiver and the timing controller which have the same structure and function as the conventional one is omitted.

The pre-driver 360C adjusts a voltage level on the node DB_NODE of the data transferrer 330 in a predetermined range prior to activation of the pre-control signal PDRVON. In particular, the pre-driver 360C uses a NMOS transistor MNO (not a PMOS transistor) to supply a power supply voltage VDD and a PMOS transistor MPO (not a NMOS transistor) to supply a ground voltage VSS.

Supplying a power supply voltage VDD through a NMOS transistor, a voltage drop generally occurs by a threshold voltage Vtn of the NMOS transistor. And supplying a ground voltage VSS through a PMOS transistor, a potential increasing by a threshold voltage Vtp of the PMOS transistor is supplied. Accordingly, a first voltage level VDD-Vtn lower than the power supply voltage (VDD) level by the threshold voltage Vtn of the NMOS transistor MNO is supplied as a maximum voltage level to the node DB_NODE. Similarly, a second voltage level VSS+Vtp higher than the ground supply voltage (VSS) level by the threshold voltage Vtp of the PMOS transistor MPO is supplied as a minimum voltage level to the node DB_NODE. The threshold voltages Vtn and Vtp represent absolute values.

Consequently, although the pre-driver 360C operates to excess due to the variation of PVT, the voltage on the node DB_NODE of the data transferrer 330 can maintained in a predetermined range from the second voltage level VSS+Vtp to the first voltage level VDD-Vtn. Since the data transferrer 300 can maintain a potential in a predetermined range at the operation of the pre-driver, it prevents the operation time of the main driver which operates after the pre-driver to be increased needlessly.

Meanwhile, as the configuration of pull-up and pull-down drivers MNO and MPO in the driving unit 920 changes, a logic level of first and second driving signals PUB and PDB for activating the drivers changes. Therefore, the configuration of the driving control unit 910 and the state storage unit 930 changes.

The state storage unit 930 stores an inverted logic state of the data transferrer 330. The state storage unit 930 includes a transfer inverter configured to transfer the inverted logic value of the data transferrer 330 in response to the pre-control signal PDRVON, and a latch configured to store an output of the transfer inverter. The transfer inverter includes four transistors in serial connected between a power supply voltage VDD and a ground voltage VSS. The four transistors are classified into two PMOS transistors for transferring a logic high level of the power supply voltage VDD and two NMOS transistors for transferring a logic low level of the ground voltage VDD. A pair of transistors including a PMOS and a NMOS transistors turn on in response to a logic level of the node DB_NODE. The other pair of transistors turn on in response to the pre-control signal PDRVON and its inverted values.

Accordingly, a logic level of the node DB_NODE is directly stored on the node A of the state storage unit 930. The driving control unit 910 generates the first and second driving signals PUB and PDB. i.e., complementary signals of the driving signals PB and PD, by using the pre-control signal PDRVON and a logic value of the data transferrer 330 which is outputted from the state storage unit 930, In this embodiment, The driving control unit 910 includes a NOR gate for generating the first driving signal PUB, an inverter for inverting the pre-control signal PDRVON and a NAND gate for generating the second driving signal PDB in response to an output of the inverter and the logic value of the data transferrer 330.

Figure 10:
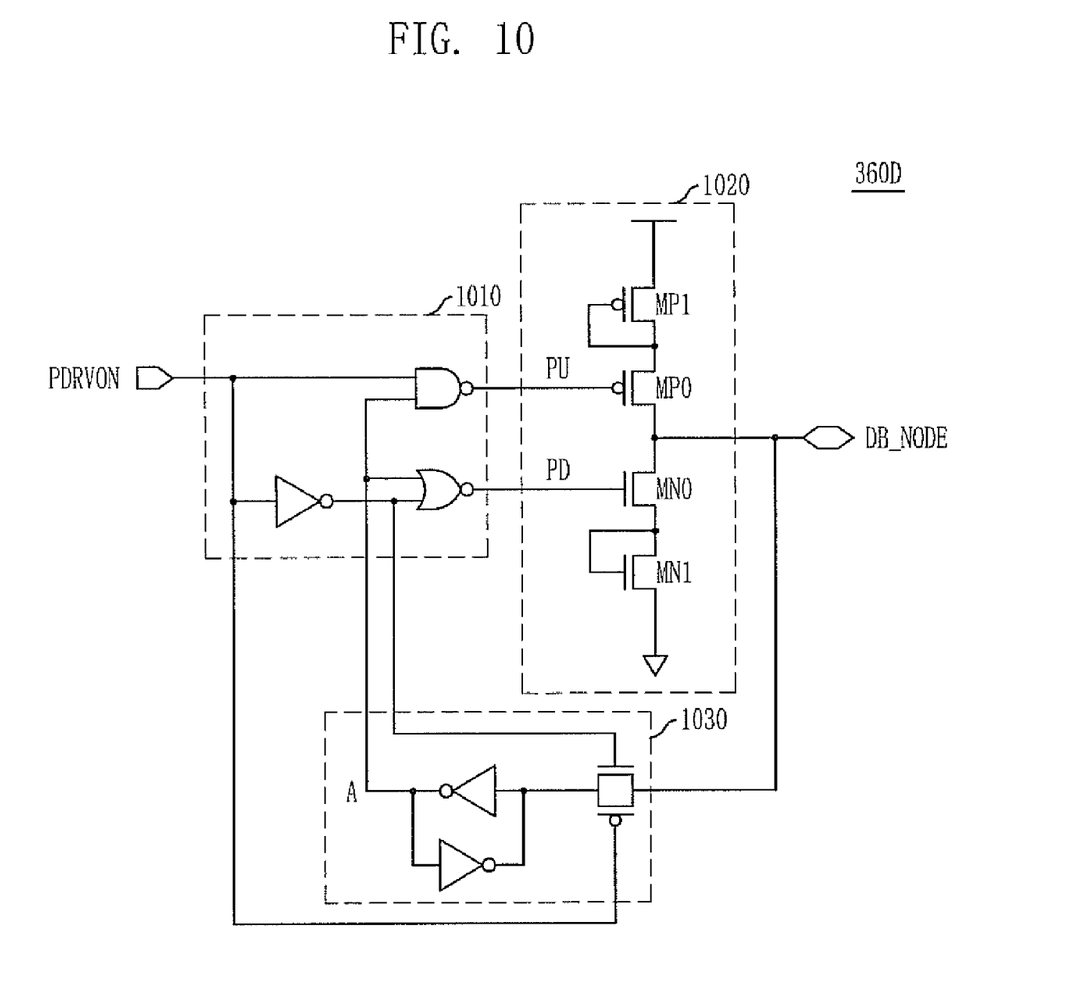
FIG. 10 is a circuit diagram of the pre-driver in accordance with a fourth embodiment of the present invention.

FIG. 10 is a circuit diagram of the pre-driver in accordance with a fourth embodiment of the present invention.

Referring to FIG. 10, the pre-driver 360D includes a driving control unit 1010, a driving unit 1020 and a state storage unit 1030. The driving unit 1020 and the state storage unit 1030 are connected to a node DB_NODE of the data transferrer 330. The driving unit 1020 of the pre-driver 360D uses a first PMOS transistor MP0 for supplying the power supply voltage VDD, i.e., a pull-up operation, and a first NMOS transistor MN0 for supplying the ground voltage VSS, i.e., a pull-down operation. The driving unit 1020 further includes a second PMOS transistor MP1 diode-connected to the first PMOS transistor for the pull-up operation and a second NMOS transistor MN1 diode-connected to the first NMOS transistor for the pull-down operation.

While the driving unit 920 of FIG. 9 uses a characteristic that a NMOS and a PMOS transistors respectively transfer a power and a ground voltages with a predetermined potential difference, the driving unit 1020 of FIG. 10 is designed to transfer supplied voltages by deducting a predetermined potential using diode-connected transistors.

After the first PMOS transistor MP0 turns on in response to the first driving signal PU, the pre-driver 360D increases a voltage level applied on the node DB_NODE of the data transferrer 330. When the voltage level increases to be a level of a power supply voltage from which a threshold voltage Vtp is deducted, i.e., VDD-Vtp, the second PMOS transistor MP1 cuts off charge supplication. Similarly, the first NMOS transistor MN0 turns on in response to the second driving signal PD and the pre-driver 360D decreases the voltage level applied on the node DB_NODE of the data transferrer 330. When the voltage level decreases is to be a level of a threshold voltage Vtn, the second NMOS transistor MN1 cuts off charge flowing.

Accordingly, the voltage level applied on the node DB_NODE is ranged from the voltage level Vtp to the voltage level VDD-Vtp. Assuming that the threshold voltages Vtn and Vtp, i.e., absolute values, of the NMOS and PMOS transistors have a same level, the voltage level Vtn is the same level as the second voltage level VSS+Vtp and the voltage level VDD-Vtp is the same level as the first voltage level VDD-Vtn.

Figure 11:
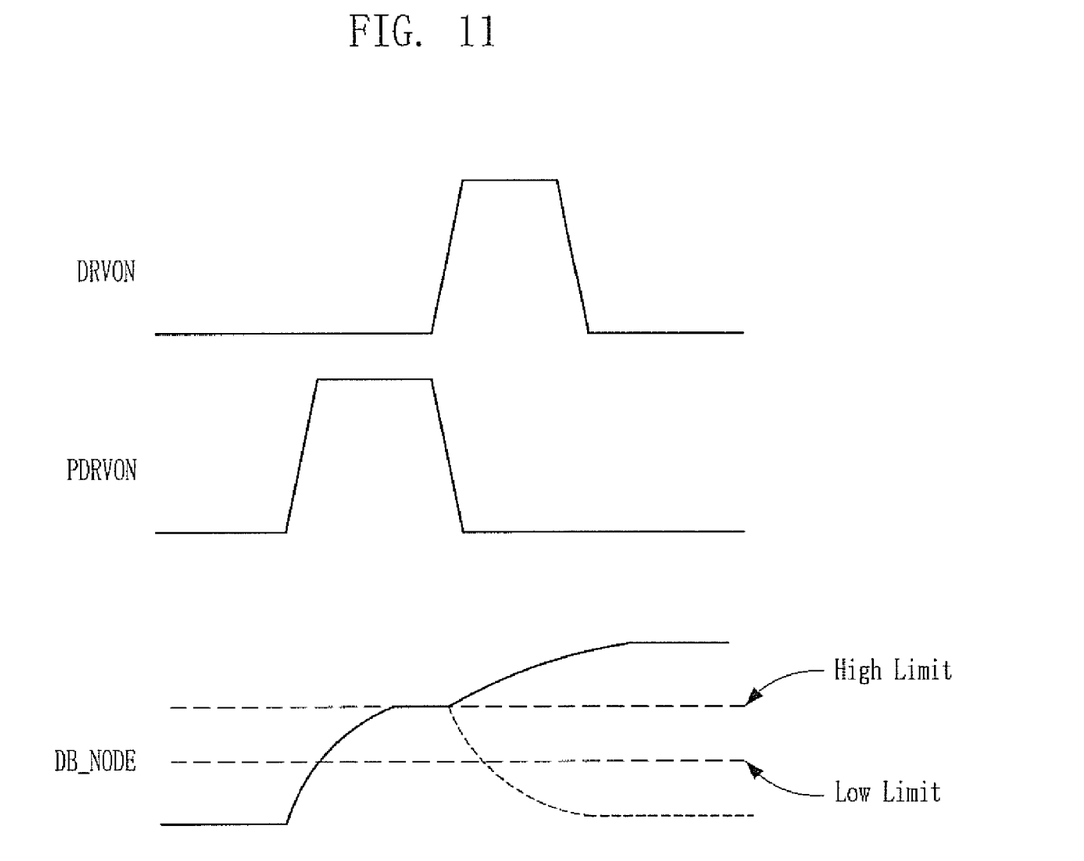
FIG. 11 is a timing diagram illustrating an operation of the pre-driver of FIG. 9.

FIG. 11 is a timing diagram illustrating an operation of the pre-driver of FIG. 9.

Referring to FIG. 11, the data DATA corresponding to the read command READ and the address is transferred after a predetermined time elapses from recognition of the read command READ. To effectively transfer the data DATA, the pre-control signal PDRVON is activated prior to the activation time point of the control signal DRVON.

Although an operation time or a voltage power for driving a voltage on the node DB_NODE of the data transferrer 330 changes due to the variation of PVT, the data transferrer 330 of the present invention can maintain the voltage on the node DB_NODE in a predetermined range. In the embodiment of the present invention, since a voltage level VDD-Vtn or VDD-Vtp is supplied to the node DB_NODE as a maximum value, the voltage on the node DB_NODE can not increase over the maximum value even though the pre-driver 360 operates to excess. On the contrary, the voltage on the node DB_NODE does not decrease below a minimum value, i.e., a voltage level VSS+Vtp or Vtn, Accordingly, the data can be transferred stably by restricting a potential supplied to the data transferrer. By using a predetermined ranged potential, it can reduce an influence that an error of an operation time and a variance of the PVT have on the data transmission.

Although the process of transferring the data through the global data lines connecting the banks and the output terminal has been described, the present invention can also be applied to a variety of electronic devices and systems which transfer signals and data corresponding to the voltage level and determine logic threshold voltages.

In accordance with the embodiments of the present invention, the signal transfer speed can be increased using the connection unit having large load by driving the connection unit prior to the operation time point.

The operation speed of systems, electronic devices, or semiconductor memory devices can be increased by reducing swing width of signals and data in a region for delaying the signal and data transfer. Further, the present invention can be applied to various fields using signals and data corresponding to voltage levels. The performance of system requiring higher operation speed can improve.

While the present invention has been described with respect to the specific embodiments, it will be apparent to those skilled in the art that various changes and modifications may be made without departing from the spirit and scope of the invention as defined in the following claims.

What is claimed is:

1. A semiconductor integrated circuit, comprising:
   a driver configured to apply data to a data line in response to a control signal;
   a data line controller configured to control a voltage level of the data line according to whether or not the voltage level of the data line is greater than a logic threshold voltage prior to activation of the control signal; and
   a pre-controller configured to output a pre-control signal for controlling the data line controller in response to the control signal and a delayed enable signal, wherein the control signal is generated by delaying an enable signal corresponding to an external read command by a first delay time and the delayed enable signal is generated by delaying the enable signal by a second delay time shorter than the first delay time.

2. The semiconductor integrated circuit as recited in claim 1, wherein the data line controller decreases the voltage level of the data line when the voltage level of the data line is greater than the logic threshold voltage, and increases the voltage level of the data line when the voltage level of the data greater is lower than the logic threshold voltage.

3. The semiconductor integrated circuit as recited in claim 1, further comprising:
   a delay unit configured to delay the enable signal by the second delay time shorter than the first delay time to output the delayed enable signal.

4. The semiconductor integrated circuit as recited in claim 1, wherein the data line controller comprises:
   a state storage unit configured to store a logic state of the data line;

a driving control unit configured to output first and second driving signals in response to a logic value of the state storage unit and the pre-control signal; and a driving unit configured to supply a predetermined voltage to the data line in response to the first and second driving signals.

5. The semiconductor integrated circuit as recited in claim 4, wherein the state storage unit comprises:
a transfer gate configured to transfer the logic state of the data line in response to the pre-control signal; and
a latch configured to store the logic state of the data line.

6. The semiconductor integrated circuit as recited in claim 4, wherein the data line controller further comprises:
a first delay unit configured to delay the first driving signal;
a second delay unit configured to delay the second driving signal; and
a third delay unit configured to delay the voltage level of the data line to supply the delayed voltage level to the state storage unit.

7. The semiconductor integrated circuit as recited in claim 1, further comprising a timing controller configured to receive the enable signal to output the control signal.

8. The semiconductor integrated circuit as recited in claim 1, wherein the voltage level of the data line increased or decreased by the data line controller is determined by a pulse width of the pre-control signal.

9. The semiconductor integrated circuit as recited in claim 1, wherein the data line is a global data line configured to connect a plurality of banks and output terminals.

10. A method for driving a semiconductor integrated circuit, the method comprising:
applying data to a data line in response to a control signal;
controlling a voltage level of the data line according to whether or not the voltage level of the data line is greater than a logic threshold voltage prior to activation of the control signal; and
outputting a pre-control signal for controlling the controlling operation of the voltage level of the data line in response to the control signal and a delayed enable signal, wherein the control signal is generated by delaying an enable signal corresponding to an external read command by a first delay time and the delayed enable signal is generated by delaying the enable signal by a second delay time shorter than the first delay time.

11. The method of claim 10, wherein the controlling of a voltage level of the data line comprises:
decreasing the voltage level of the data line when the voltage level of the data line is greater than the logic threshold voltage; and
increasing the voltage level of the data line when the voltage level of the data greater is lower than the logic threshold voltage.

12. The method of claim 10, wherein the controlling of a voltage level of the data line comprises:
storing a logic state of the data line;
outputting first and second driving signals in response to the stored logic state and the pre-control signal; and
supplying a predetermined voltage to the data line in response to the first and second driving signals.

13. The method of claim 12, wherein the controlling of a voltage level of the data line further comprises:
delaying the first driving signal;
delaying the second driving signal; and
delaying the voltage level of the data line to supply the delayed voltage level to be stored.

14. The method of claim 10, wherein an increasing or decreasing degree of the voltage level of the data line is determined by a pulse width of the pre-control signal.

* * * * *